United States Patent
Horita et al.

(10) Patent No.: US 6,503,799 B2
(45) Date of Patent: Jan. 7, 2003

(54) METHOD OF MANUFACTURING SEMICONDUCTOR DEVICE

(75) Inventors: Katsuyuki Horita, Tokyo (JP); Takashi Kuroi, Tokyo (JP); Shuuichi Ueno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/991,959

(22) Filed: Nov. 26, 2001

(65) Prior Publication Data

US 2002/0127841 A1 Sep. 12, 2002

(30) Foreign Application Priority Data

Mar. 8, 2001 (JP) ........................... 2001-064276

(51) Int. Cl.⁷ ............................................ H01L 21/205
(52) U.S. Cl. ................... 438/269; 438/341; 438/412; 438/430; 438/442; 438/481
(58) Field of Search ................... 438/222, 226, 438/269, 341, 357, 360, 361, 363, 412, 413, 429, 430, 442, 481

(56) References Cited

U.S. PATENT DOCUMENTS

| | | | | |
|---|---|---|---|---|
| 3,574,008 A | * | 4/1971 | Rice | 438/481 |
| 4,755,481 A | * | 7/1988 | Faraone | 438/165 |
| 4,778,775 A | * | 10/1988 | Tzeng | 438/214 |
| 5,100,830 A | * | 3/1992 | Morita | 438/442 |
| 5,308,445 A | * | 5/1994 | Takasu | 438/481 |
| 5,681,776 A | * | 10/1997 | Hebert et al. | 438/442 |
| 5,780,343 A | * | 7/1998 | Bashir | 438/269 |
| 5,795,823 A | * | 8/1998 | Avanzino et al. | 438/701 |
| 5,854,509 A | * | 12/1998 | Kunikiyo | 257/506 |
| 5,915,192 A | | 6/1999 | Liaw et al. | 438/424 |
| 5,940,731 A | * | 8/1999 | Wu | 438/640 |
| 5,948,162 A | * | 9/1999 | Nakamura | 117/90 |
| 5,963,822 A | * | 10/1999 | Saihara et al. | 438/481 |
| 6,228,691 B1 | * | 5/2002 | Doyle | 438/430 |

FOREIGN PATENT DOCUMENTS

| | | | | |
|---|---|---|---|---|
| JP | 58-056323 | * | 4/1983 | ......... H01L/21/205 |
| JP | 58-057745 | * | 4/1983 | ........... H01L/27/08 |
| JP | 61-150213 | | 7/1986 | |
| JP | 61-177742 | | 8/1986 | |
| JP | 09-134955 | * | 5/1997 | ........... H01L/21/76 |

* cited by examiner

*Primary Examiner*—Olik Chaudhuri
*Assistant Examiner*—Anh Duy Mai
(74) *Attorney, Agent, or Firm*—Oblon, Spivak, McClelland, Maier & Neustadt, P.C.

(57) ABSTRACT

There is provided a method of forming an element isolation structure that can maintain its element isolation capability even with the progress of miniaturization of semiconductor elements. Through thermal processing in a nitrogen atmosphere at 900° C., a non single-crystal silicon film (80) is crystallized into single-crystal form by epitaxial growth on the main surface of a substrate, thereby to form an epitaxial silicon film (85). The epitaxial silicon film (85) is then planarized by CMP to expose the upper surface of an element isolation insulating film (50). This completes the element isolation insulating film (50) having a two-level protruding shape.

7 Claims, 11 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and especially to a method of forming an element isolation insulating film for element isolation.

2. Description of the Background Art

Semiconductor integrated circuits are becoming denser and at the same time, they have accomplished enhanced speed and reduced power supply voltage. Especially in advanced integrated logic circuits including an MPU (Micro Processing Unit), transistor performance and current driving capability for each channel width or, in other words, per unit area have been enhanced in achieving both the enhanced speed and reduced power supply voltage at the same time.

Transistors with higher current driving capability require a smaller area to obtain a sufficient output current and thus can achieve larger packing densities.

On the other hand, as an element isolation technique for electrically isolating a number of elements from one another, trench isolation has been adopted to achieve further improvements in the scale of integration. The trench isolation is a technique for electrically isolating elements by filling a trench formed between each element with an insulator, which with improvements in burying technique, allows the formation of a narrower, deeper element isolation insulating film.

Here, the width of the element isolation insulating film, i.e., the dimension in a direction to define the isolation spacing, is restricted by the amplitude of the power supply voltage and cannot be reduced by the neglect of the power supply voltage.

It is, however, not easy to decrease the power supply voltage and under the present circumstances, a reduction of the power supply voltage has not so much been advanced as the progress of reducing the width (hereinafter referred to a "separation width") of the element isolation insulating film. From this, a further reduction in the separation width is not easy, which becomes one of the factors that prevent the improvement of integration.

Figure 20:
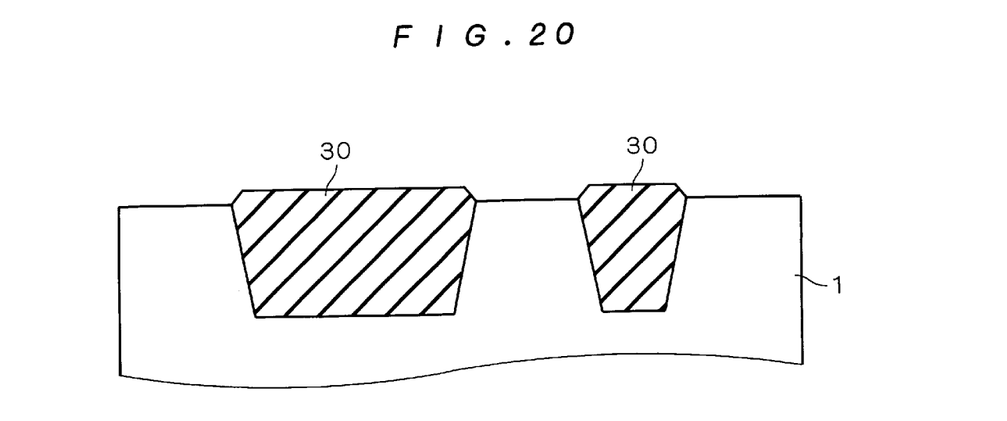
FIG. 20 is a cross-sectional view of an element isolation insulating film in a conventional semiconductor device.

FIG. 20 is a cross-sectional view illustrating part of a conventional semiconductor device in manufacturing process. In FIG. 20, an element isolation insulating film 30 made of a silicon oxide film is selectively located in the main surface of a semiconductor substrate 1. The element isolation insulating film 30 has a tapered cross-sectional shape that narrows with approach from the main surface side of the semiconductor substrate 1 toward its bottom surface, the shape being suitable for the process of filling the silicon oxide film.

Hereinbelow, a method of manufacturing the element isolation insulating film 30 will be set forth with reference to FIGS. 21 to 23, which are cross-sectional views illustrating a method of manufacturing a conventional semiconductor device.

Figure 21:
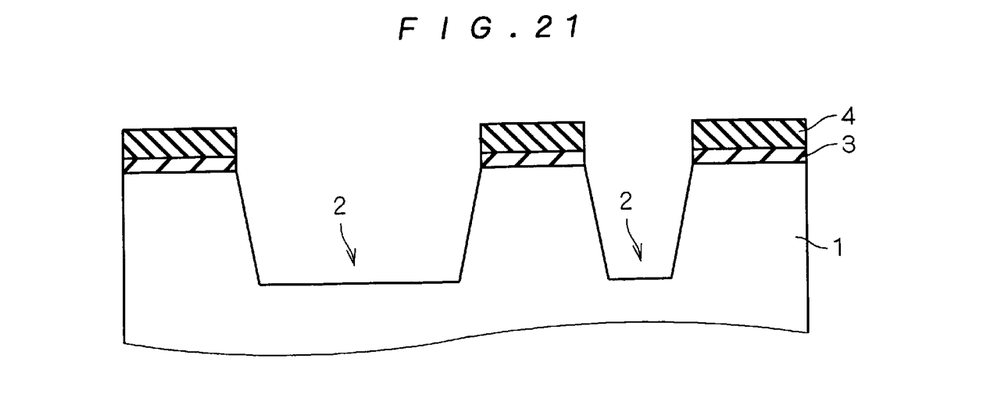
FIGS. 21 to 23 are cross-sectional views illustrating a manufacturing process of a conventional semiconductor device.

In the step of FIG. 21, a silicon oxide film 3 and a silicon nitride film 4 are sequentially deposited over the whole main surface of the semiconductor substrate 1 and a photoresist mask (not shown) is selectively formed on a region where the element isolation insulating film is formed. Using the photoresist mask, the silicon nitride film 4 and the silicon oxide film 3 are selectively removed by anisotropic etching. After removal of the photoresist mask, a trench 2 is selectively formed by anisotropic etching with the silicon nitride film 4 as a mask.

Figure 22:
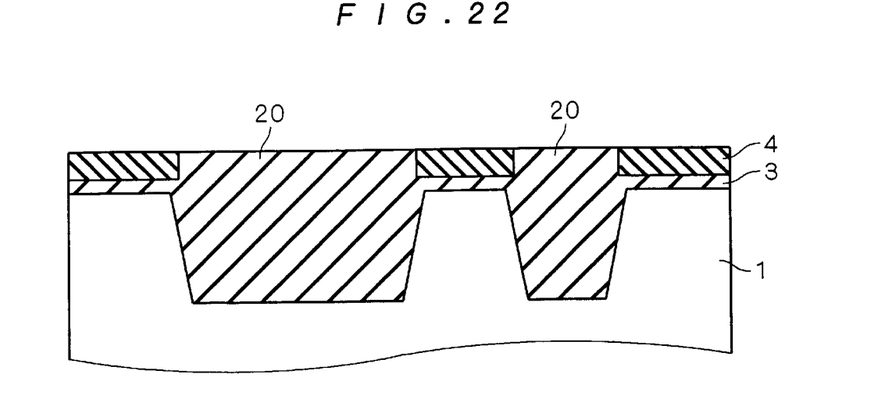

In the step of FIG. 22, after etching damage is eliminated by a technique such as thermal oxidation of the trench 2, a silicon oxide film 20 is formed over the whole surface by CVD so that the trench 2 is filled with the silicon oxide film 20. The surface of the silicon oxide film 20 is then planarized by CMP (Chemical-Mechanical Polishing) using the silicon nitride film 4 as a stopper, so that the silicon oxide film 20 is left only in the trench 2.

Figure 23:
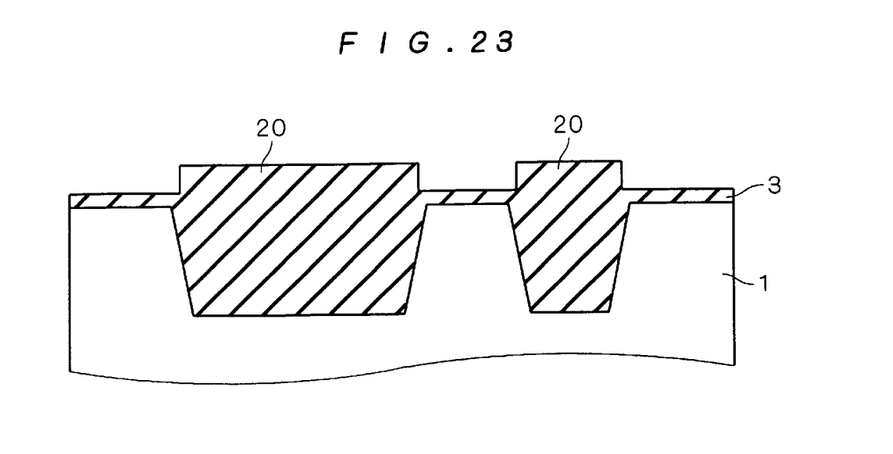

After that, the silicon nitride film 4 is removed and with the silicon oxide film 3 left as shown in FIG. 23, the formation of well region and ion implantation for determination of the threshold voltage of transistors are performed.

Subsequent removal of the silicon oxide film 3 completes the element isolation insulating film 30 shown in FIG. 20.

Thereafter, a gate electrode, source/drain regions, and the like are formed in each active region defined by the element isolation insulating film 30, whereby a semiconductor element such as a MOSFET is formed. Such semiconductor elements are connected through a wiring layer, which completes a semiconductor device.

Since the element isolation insulating film in the conventional semiconductor device is tapered toward its bottom as above described and the width of the bottom surface, which determines the separation capability, is narrowest, the only way to obtain a sufficient separation capability is by increasing the width of the upper portion or by deepening the trench.

Deepening the trench, however, imposes limitations on the amount of reduction of the separation width in view of the burying technique for insulating film and consequently prevents the reduction in the size of semiconductor device.

One of measures to resolve part of such a device miniaturization problem is disclosed in U.S. Pat. No. 5,915,192. The technique disclosed is to widen a lower portion of the element isolation insulating film by isotropic etching thereby to increase the effective separation width.

Figure 24:
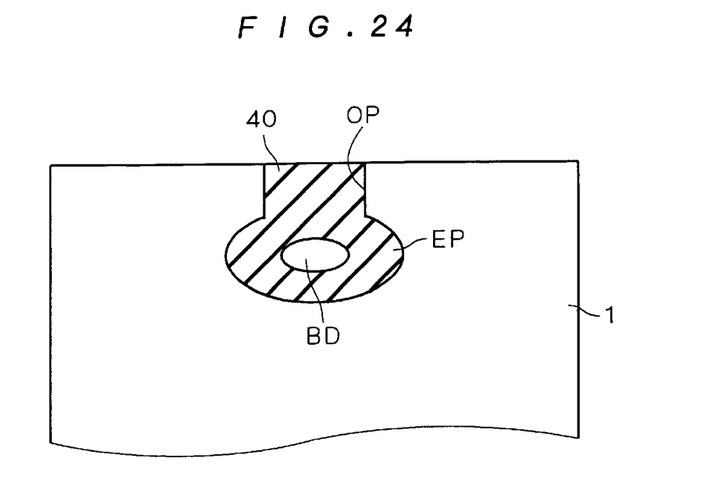
FIG. 24 is a cross-sectional view of an element isolation insulating film in a conventional semiconductor device.

FIG. 24 is a schematic diagram of a configuration disclosed in U.S. Pat. No. 5,915,192. In FIG. 24, a trench is located in the surface of the semiconductor substrate 1 and an insulating film is buried therein to form an element isolation insulating film 40. The trench has an expanded portion EP forming the lower portion of an oval cross-sectional shape and an opening OP formed in the main surface of the semiconductor substrate 1 in communication with the expanded portion EP and having a smaller width than the expanded portion EP.

The element isolation insulating film 40 of such a shape is characterized by its sufficient separation capability resulting from the wide bottom surface, but when an insulating film is buried in the trench, a great void BD may be formed in the expanded portion EP as shown in FIG. 24. The void BD is a residual gap not filled with the insulating film after the process of filling the trench and is expected to be formed in the central portion of the expanded portion EP so as to be enclosed with the insulating film. The formation of such a void BD can cause a problem of inhibiting the uniformity of ion implantation. This problem will be considered with reference to FIGS. 25 to 28.

Figure 25:
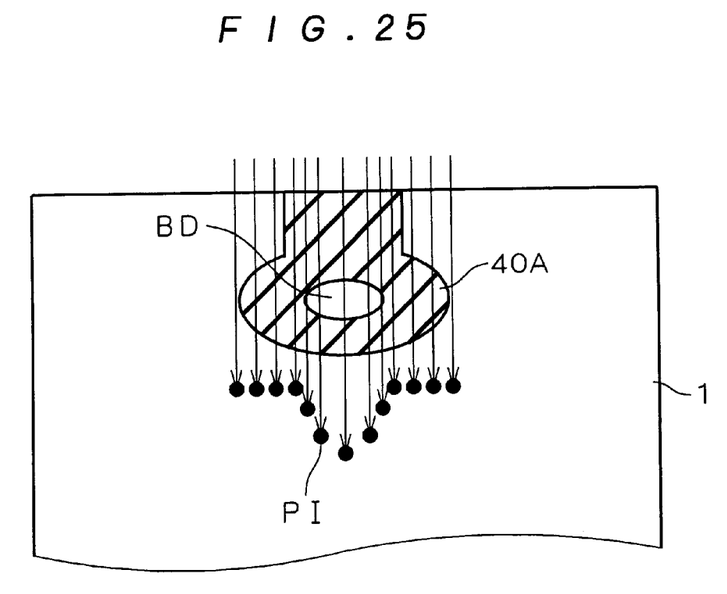
FIGS. 25 and 26 are cross-sectional views illustrating a manufacturing process of a conventional semiconductor device.
Figure 26:
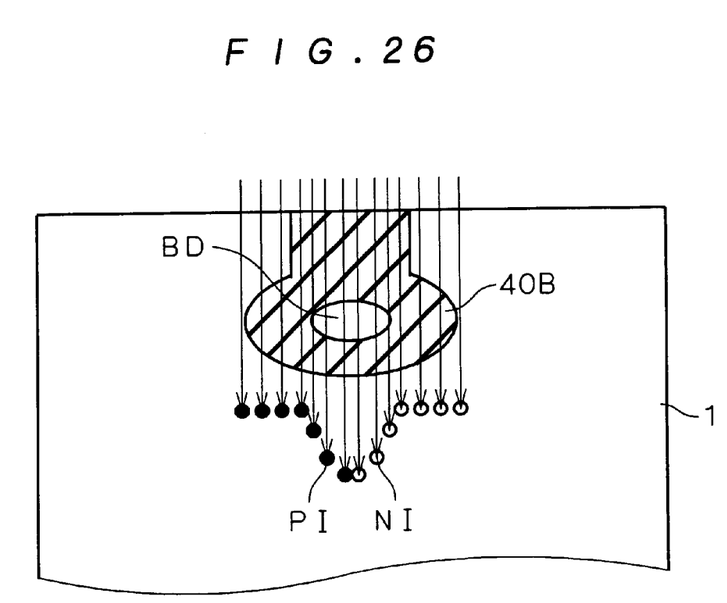

FIGS. 25 and 26 illustrate an element isolation insulating film 40A formed for element isolation and an element isolation insulating film 40B formed for well isolation, respectively. The element isolation insulating films 40A and 40B are basically identical to the element isolation insulating film 40 shown in FIG. 24, but for convenience's sake, they are denoted by the different reference numerals.

As shown in FIG. 25, after the element isolation insulating film 40A is formed in the surface of the semiconductor substrate 1, a P-type impurity PI is doped by ion implantation for formation of a well region, in this case a P-type well region.

Also as shown in FIG. 26, after the element isolation insulating film 40B is formed in the surface of the semiconductor substrate 1, a P-type impurity PI and an N-type impurity NI are doped by ion implantation for formation of well regions, in this case P- and N-type well regions, respectively.

For the sake of simplicity, FIGS. 25 and 26 schematically show only the ion implantation in the vicinity of the element isolation insulating films 40A and 40B.

The void BD, as compared with the insulating film (silicon oxide film) and the semiconductor substrate (silicon substrate), has substantially no capability to block implant ions. In the element isolation insulating films 40A and 40B, therefore, the speed of implant ions passing through the void BD is not reduced and if all ions are doped at the same implant energy, ions which have passed through the void BD will reach deeper points than those which have not.

Under the void BD, therefore, the implant ions won't stop at target implant points in the vicinity of the bottom surface of the isolation insulating film and will reach further lower points.

Figure 27:
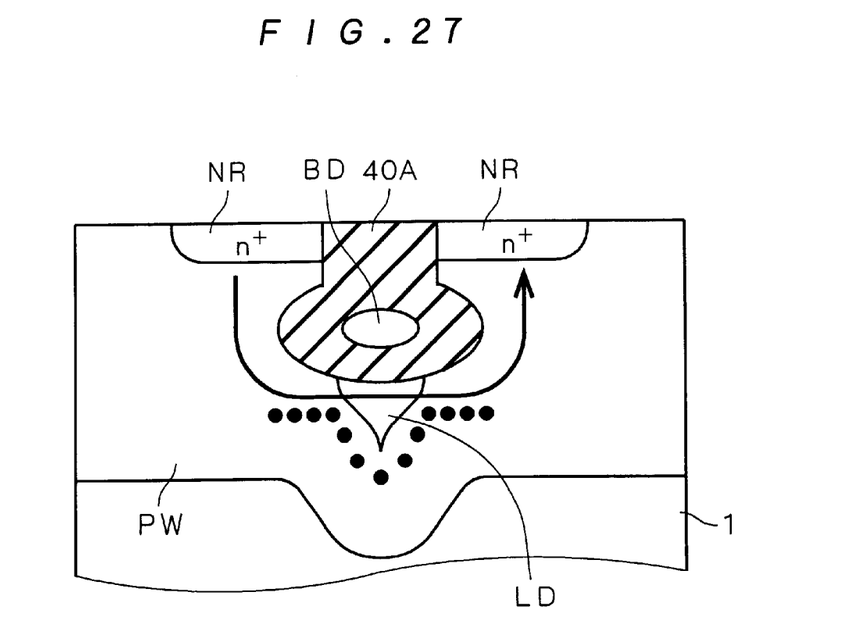
FIGS. 27 and 28 are cross-sectional views for explaining problems of conventional semiconductor devices.

Consequently, in the element isolation insulating film 40A as shown in FIG. 27, a low-concentration region LD where the concentration of the P-type impurity PI is lower than in a surrounding P-type well region PW (e.g., at about the same level as the original impurity concentration level of the semiconductor substrate 1) is formed in a portion of the semiconductor substrate 1 located under the void BD.

In this condition, if semiconductor elements are formed on both sides of the element isolation insulating film 40A, a punch-through current (indicated by the arrow) will flow through the low-concentration region LD between impurity regions (in this case, N-type impurity regions NR), each constituting one of the semiconductor elements.

Figure 28:
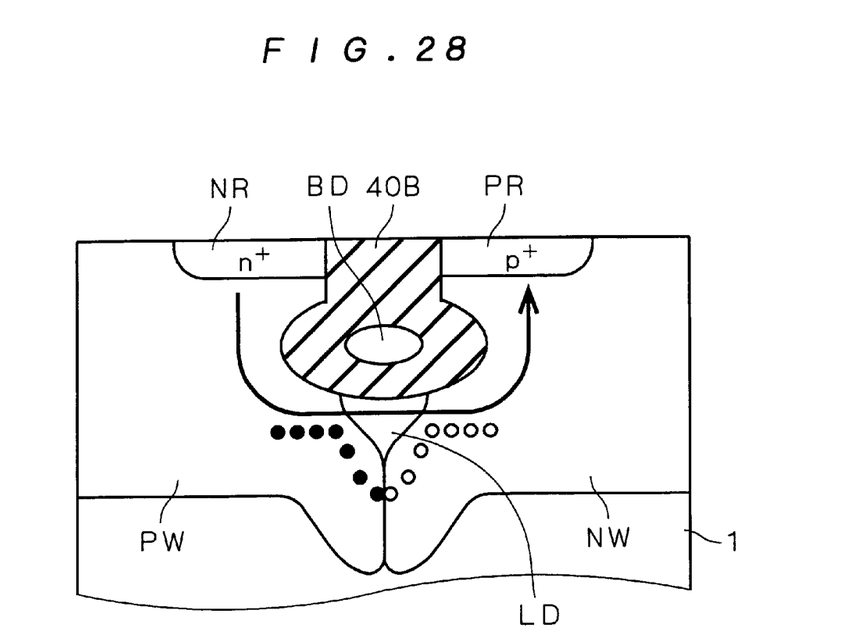

In the element isolation insulating film 40B as shown in FIG. 28, a P-type well region PW and an N-type well region NW are formed on both sides, forming a junction interface therebetween at the bottom surface of the element isolation insulating film 40B. However, a low-concentration region LD where the concentrations of the P- and N-type impurities PI and NI are lower than in the surrounding P-well and N-well regions PW and NW is formed in a portion of the semiconductor substrate 1 located under the void BD.

In this condition, if semiconductor elements are formed on both sides of the element isolation insulating film 40B, a punch-through current (indicated by the arrow) will flow through the low-concentration region LD between impurity regions (in this case, N- and P-type impurity regions NR and PR), each constituting one of the semiconductor elements.

As above described, even if the element isolation insulating films 40A and 40B each have the wide bottom surface by the presence of the expanded portion EP, the void BD in the expanded portion EP weakens the separation capability and consequently, it is expected that the separation width cannot be reduced.

While the element isolation insulating film in the conventional semiconductor device shown in FIG. 20 is tapered toward its bottom, Japanese Patent Application laid-Open No. 61-150213 discloses a technique for forming an element isolation insulating film which is tapered toward its top, wherein the tapered element isolation insulating film is formed on a silicon substrate by etching and a subsequent epitaxial process produces crystal growth of the silicon substrate to form an active region.

As compared with the element isolation insulating film 30 of FIG. 20 which is tapered toward its bottom, the above element isolation insulating film has a greater effective separation width, but it is difficult to form, by etching, a steeply-inclined element isolation insulating film with great controllability. This imposes imitations on the effective separation width that can be ensured.

Further, Japanese Patent Application Laid-Open No. 61-177742 discloses a technique for forming a stepped element isolation insulating film which gets wide at the bottom and narrow at the top.

More specifically, a trench which reaches a silicon substrate is formed in an oxide film on the silicon substrate and a silicon oxide film is formed at the bottom of the trench. The silicon oxide film at the bottom is selectively removed in the central portion of the trench thereby to form an opening consisting of two communicating openings, the upper one being wide and the lower one being narrow, and an epitaxial layer of silicon is formed in that opening. This produces a stepped element isolation insulating film which gets wide at the bottom and narrow at the top, surrounding the epitaxial layer.

In recent densely packed semiconductor elements, however, it is required to form a narrow upper opening, which defines an active region, for the above technique; therefore, forming a further narrower lower opening in the trench is expected to be difficult from the viewpoint of alignment accuracy.

SUMMARY OF THE INVENTION

A first aspect of the present invention is directed to a method of manufacturing a semiconductor device comprising the steps of: (a) forming an insulating film on a whole main surface of a semiconductor substrate; (b) selectively forming an etching mask on a whole surface of the insulating film and selectively etching the insulating film by using the etching mask to such an extent as not to expose the main surface of the semiconductor substrate, thereby to pattern a portion of the insulating film which is covered with the etching mask into an upper protruding portion; (c) forming a spacer to cover a side surface of the upper protruding portion; (d) removing a portion of the insulating film which is not covered with the etching mask and the spacer by etching so as to expose the main surface of the semiconductor substrate, thereby to pattern a portion of the insulating film which is covered with the upper protruding portion and the spacer into a lower protruding portion; (e) removing the etching mask and the spacer and thereby forming an element isolation insulating film having a two-level protruding shape including a succession of the upper protruding portion and the lower protruding portion which is wider than the upper protruding portion; and (f) filling in a pattern defined by the element isolation insulating film with a single-crystal semiconductor film.

According to a second aspect of the present invention, in the manufacturing method of a semiconductor device, the insulating film is formed of a thermal oxide film. According to a third aspect of the present invention, in the manufacturing method of a semiconductor device, the spacer is formed of a silicon nitride film, and the step (c) includes the steps of: forming a silicon nitride film on a whole surface including a surface of the etching mask; and removing the silicon nitride film by anisotropic etching so that the silicon nitride film is left as the spacer on the side surface of the upper protruding portion.

A fourth aspect of the present invention is directed to a method of manufacturing a semiconductor device, comprising the steps of: (a) preparing an SOI substrate comprising a buried insulating film located on a semiconductor substrate and an SOI layer located on the buried insulating film; (b) selectively forming an insulating film in the SOI layer so that the bottom surface of the insulating film reaches the buried insulating film through the SOI layer; (c) removing the SOI layer until the buried insulating film is exposed, so that the insulating film protrudes above the buried insulating film, forming an upper protruding portion; (d) forming an etching mask to cover the upper protruding portion and its surroundings and removing the buried insulating film by anisotropic etching, thereby to pattern a portion of the buried insulating film which is covered with the etching mask into a lower protruding portion; (e) removing the etching mask and thereby forming an element isolation insulating film having a two-level protruding shape including a succession of the upper protruding portion and the lower protruding portion which is wider than the upper protruding portion; and (f) filling in a pattern defined by the element isolation insulting film with a single-crystal semiconductor film.

According to a fifth aspect of the present invention, in the manufacturing method of a semiconductor device, the semiconductor substrate is a single-crystal silicon substrate, and the step (f) includes the steps of: (f-1) filling in a pattern defined by the element isolation insulating film with a non single-crystal silicon film; and (f-2) crystallizing the non single-crystal silicon film into a single-crystal silicon film by epitaxial growth on the single-crystal silicon substrate.

According to a sixth aspect of the present invention, in the manufacturing method of a semiconductor device, the step (f-1) includes the step of completely covering the element isolation insulating film with the non single-crystal silicon film, and the step (f-2) includes the step of planarizing the single-crystal silicon film until an upper surface of the element isolation insulating film is exposed, so that the single-crystal silicon film is left only in a pattern defined by the element isolation insulating film.

According to a seventh aspect of the present invention, in the manufacturing method of a semiconductor device, the step (f-1) includes the steps of: completely covering the element isolation insulating film with the non single-crystal silicon film; and planarizing the non single-crystal silicon film until an upper surface of the element isolation insulating film is exposed, so that the non single-crystal silicon film is left only in a pattern defined by the element isolation insulating film.

According to an eighth aspect of the present invention, in the manufacturing method of a semiconductor device, the semiconductor substrate is a single-crystal silicon substrate, and the step (f) includes the step of growing a single-crystal silicon film on the single-crystal silicon substrate by selective epitaxial growth in a pattern defined by the element isolation insulating film.

The manufacturing method of a semiconductor device according to the first aspect can produce an element isolation insulating film having a two-level protruding shape. Since the width of the bottom surface (effective separation width) of the element isolation insulating film is greater than the width of the top surface (outward separation width), the separation capability is improved. Correspondingly, the outward separation width can be more reduced in design than before, which allows a reduction in device dimensions. In forming the element isolation insulating film, the spacer is formed on the side surface of the upper protruding portion and a portion of the insulating film which is covered with the upper protruding portion and the spacer is patterned into the lower protruding portion. Therefore, the width of the bottom surface of the lower protruding portion can be determined with great accuracy by the horizontal thickness of the spacer and the width of the upper protruding portion.

In the manufacturing method of a semiconductor device according to the second aspect, the insulting film formed of a thermal oxide film prevents the element isolation insulating film from including a seam or void in principle and the doping depth of impurities during impurity doping through the element isolation insulating film can be determined with precision. Further, the element isolation insulating film has excellent chemical resistance (small etch rate in wet etching), achieves ease of handling in subsequent steps, and is characteristically in good interface condition with the silicon substrate.

In the manufacturing method of a semiconductor device according to the third aspect, the etching mask and the spacer are formed of a silicon nitride film. Thus, when the insulating film is a silicon oxide film, high etch selectivity can be achieved in etching of the silicon oxide film and a desired shape of element isolation insulating film can be formed with reliability.

The manufacturing method of a semiconductor device according to the fourth aspect can produce an element isolation insulating film having a two-level protruding shape. Since the width of the bottom surface (effective separation width) of the element isolation insulating film is greater than the width of the top surface (outward separation width), the separation capability is improved. Correspondingly, the outward separation width can be more reduced in design than before, which allows a reduction in device dimensions. Further, since conventional manufacturing methods can be adopted in the formation of the upper protruding portion and the lower protruding portion is formed by etching of the buried oxide film in the SOI substrate, the manufacturing cost can be reduced. Even if the upper protruding portion is formed by using a conventional technique for filling an insulating film, the possibility that a seam or void may occur in the relatively shallow upper protruding portion is small and in addition, the lower protruding portion is formed by etching of the buried insulating film. This allows a dense element isolation insulating film to be formed with stability. Accordingly, the doping depth of impurities during impurity doping through the element isolation insulating film can be determined with precision.

In the manufacturing method of a semiconductor device according to the fifth aspect, after the pattern defined by the element isolation insulating film is filled with the non single-crystal silicon film, the non single-crystal silicon film is crystallized into a single-crystal semiconductor film to obtain a single-crystal semiconductor film. This makes it relatively easy to form a single-crystal semiconductor film.

In the manufacturing method of a semiconductor device according to the sixth aspect, the non single-crystal silicon film which completely covers the element isolation insulating film is crystallized into single-crystal form and then the single-crystal silicon film is planarized. Thereby, the single-crystal silicon film can be located with reliability in a pattern defined by the element isolation insulating film.

In the manufacturing method of a semiconductor device according to the seventh aspect, the non single-crystal silicon film which completely covers the element isolation insulating film is planarized and then crystallized into single-crystal form. This shortens the time required for crystallization of silicon into single-crystal form.

In the manufacturing method of a semiconductor device according to the eighth aspect of the present invention, the single-crystal silicon film is grown on the single-crystal silicon substrate by selective epitaxial growth in a pattern defined by the element isolation insulating film, whereby the single-crystal semiconductor film is obtained. Thus, the resultant single-crystal semiconductor film has excellent crystallinity.

An object of the present invention is to provide a method of forming an element isolation structure that can maintain the element isolation capability even with the progress of miniaturization of semiconductor elements.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment
<A-1. Manufacturing Method>

A method of manufacturing a semiconductor device according to a first preferred embodiment of the present invention will be set forth with reference to FIGS. 1 to 6, illustrating a process sequence for the manufacture of a semiconductor device.

Figure 1:
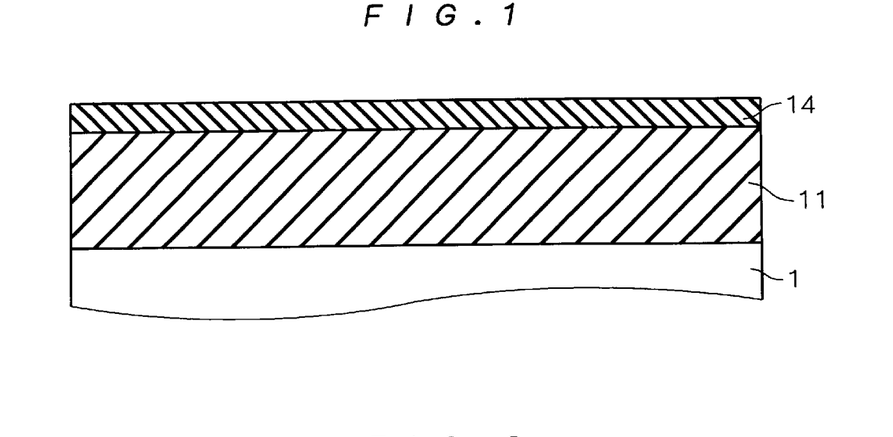
FIGS. 1 to 6 are cross-sectional views illustrating a manufacturing process of a semiconductor device according to a first preferred embodiment of the present invention.

In the step of FIG. 1, a silicon oxide film 11 of 150- to 300-nm thickness is formed by thermal oxidation on the main surface of a semiconductor substrate 1 (single-crystal silicon substrate). Then, a silicon nitride film 14 of 50- to 200-nm thickness is formed by CVD on the silicon oxide film 11. FIG. 1 is a cross-sectional view of a semiconductor device in a stage after this step.

Figure 2:
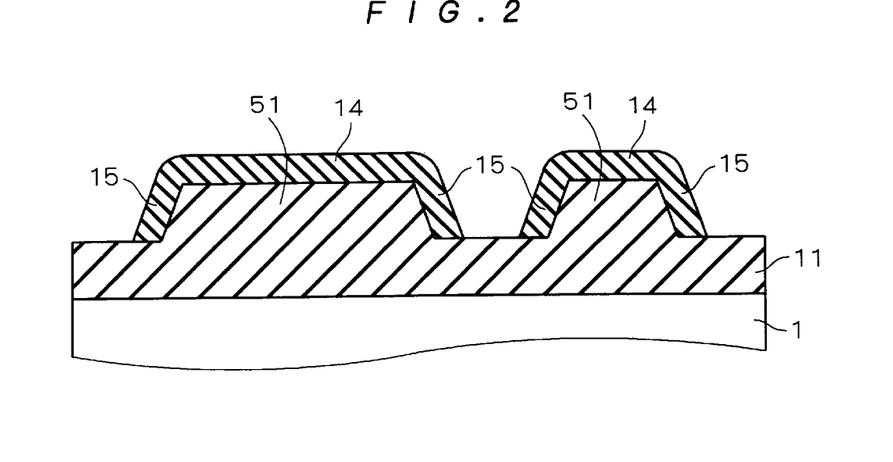

In the step of FIG. 2, a photoresist mask (not shown) is selectively formed on a region where an element isolation insulating film is formed. Using the photoresist mask, the silicon nitride film 14 which is located on a region where the element isolation insulating film is not formed is selectively removed by anisotropic etching.

Further, the silicon oxide film 11 is removed to a depth of about 50 to 150 nm so as not to expose the surface of the semiconductor substrate 1, thereby to form upper protruding portions 51. At this time, the upper protruding portions 51 have a tapered cross-sectional shape that widens with approach from the main surface of the semiconductor substrate 1 toward their bottom surfaces, but this is not intentional.

After removal of the photoresist mask, a silicon nitride film of about a 50- to 200-nm thickness is formed by CVD over the whole surface. In the step of FIG. 2, the silicon nitride film is etched back by anisotropic etching to form spacer nitride films 15 on the side surfaces of the upper protruding portions 51. FIG. 2 is a cross-sectional view of the semiconductor device in a stage after this step.

Figure 3:
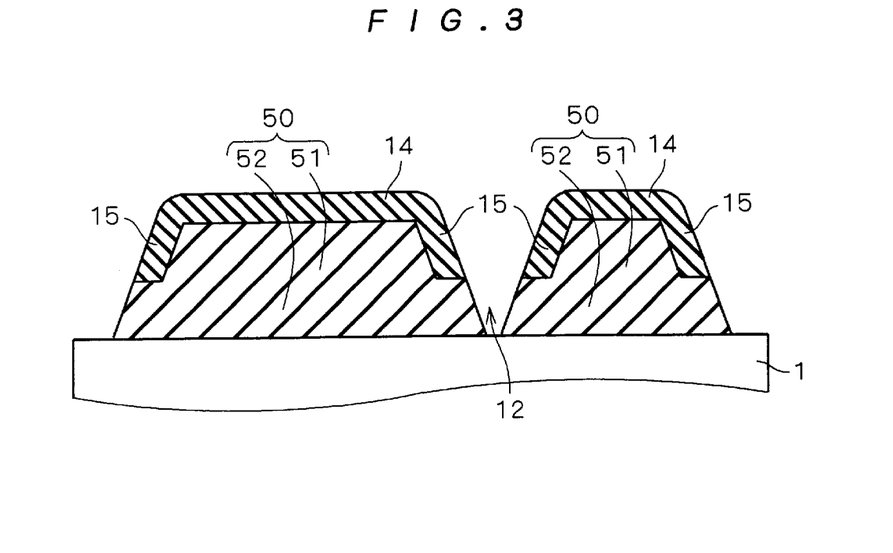

In the step of FIG. 3, the silicon oxide film 11 which is not covered with either the silicon nitride film 14 or 15 is removed by anisotropic etching to expose the surface of the semiconductor substrate 1, whereby a trench 12 and element isolation insulating films 50 are formed. The element isolation insulating films 50 formed by this step have a two-level protruding cross-sectional shape consisting of two successive protruding portions: the upper protruding portion 51 and a tapered lower protruding portion 52 which is located under the upper protruding portion 51 and is wider than the upper protruding portion 51. Here, the tapered form of the lower protruding portion 52 is not intentional. FIG. 3 is a cross-sectional view of the semiconductor device in a stage after this step.

Figure 4:
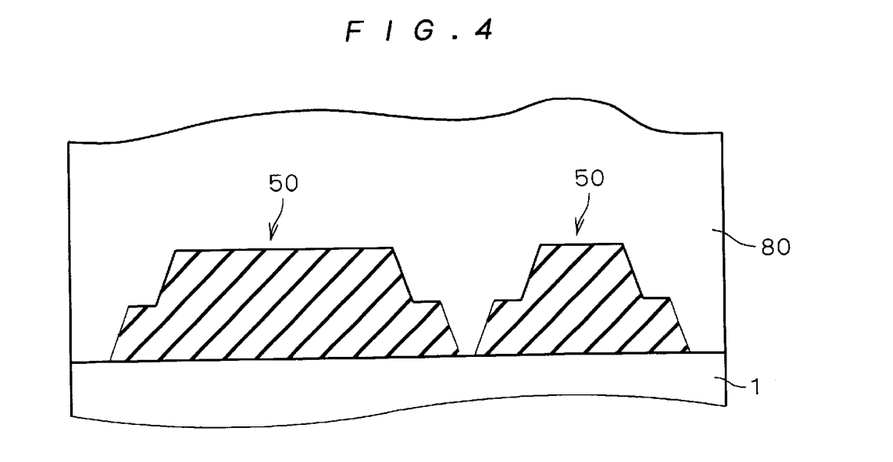

In the step of FIG. 4, the silicon nitride films 14 and 15 are removed and a non single-crystal silicon film 80 of about a 300- to 800-nm thickness is formed by CVD to fill in the trench 12 and to cover the element isolation insulating films 50. FIG. 4 is a cross-sectional view of the semiconductor device in a stage after this step.

Figure 5:
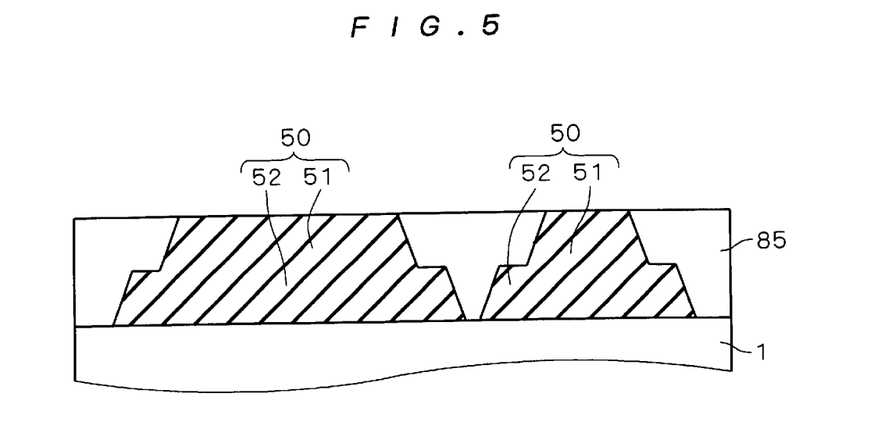

In the step of FIG. 5, for example through thermal processing in a nitrogen atmosphere at 900° C., the non single-crystal silicon film 80 is crystallized into single-crystal form by its epitaxial growth on the main surface of the substrate 1, whereby an epitaxial silicon film 85 is formed.

The epitaxial silicon film 85 is then planarized by CMP to expose the upper surfaces of the element isolation insulating films 50. This completes the element isolation insulating films 50 each having a two-level protruding cross-sectional shape.

While in FIG. 5 the left- and right-hand element isolation films 50 are formed in different widths, this is just one example and it goes without saying that they may be of the same width.

The crystallization of the non single-crystal silicon film 80 into single-crystal form may be performed after the planarization. Or, as an alternative to crystallizing the non single-crystal silicon film 80 into single-crystal form, a single-crystal silicon film may be grown and deposited on the main surface of the substrate by selective epitaxial growth.

More specifically, if raw gas is a mixture of chlorine gas (HCl) and dichlorosilane ($SiH_2Cl_2$), under a reduced pressure at approximately 850° C., a single-crystal silicon film does not grow on the oxide film but grows only on the semiconductor substrate 1 of single-crystal silicon.

Thereafter, if necessary, the semiconductor substrate 1 may be heated for example in an atmosphere of oxygen at 800° C. for about an hour, thereby to reduce interface states of the sidewalls of the element isolation insulating films 50. Reducing the interface states reduces junction leakage and results in reduced power consumption of the semiconductor device.

Subsequently performed are ion implantation (well implantation) for formation of well regions and ion implantation (channel implantation) for determination of the threshold voltage of transistors.

Figure 6:
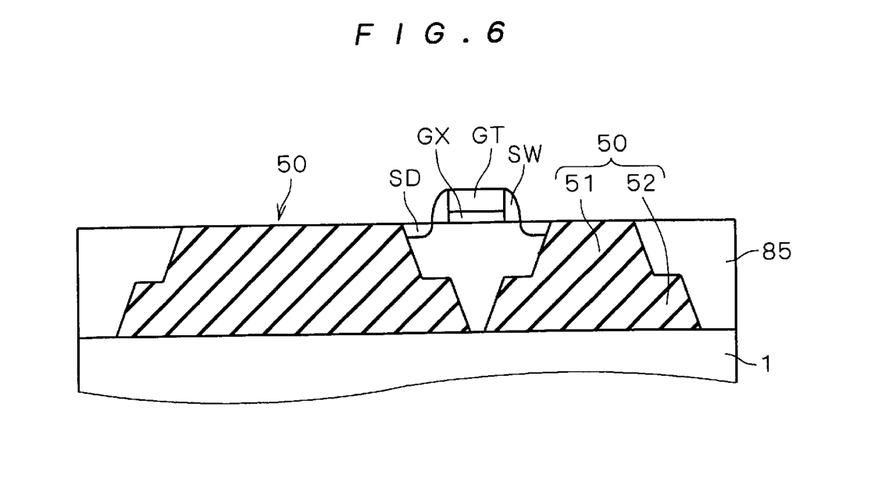

Then, as shown in FIG. 6, a gate insulating film GX, a gate electrode GT, sidewall spacers SW, and the like are formed on each active region defined by the element isolation insulating films 50 and impurity regions such as source/drain layers SD are formed in the surface of the active region, whereby a semiconductor element such as a MOSFET is formed. Such semiconductor elements are connected through a wiring layer, which completes a semiconductor device.

<A-2. Function and Effect>

As has been described so far, the manufacturing method of this preferred embodiment can produce the element isolation insulating film 50 having the two-level protruding shape. Since the width of the bottom surface (effective separation width) is greater than the width of the top surface (outward separation width), the element isolation insulating film 50 has a greater separation width and higher separation capability than the element isolation insulating film 30 shown in FIG. 20. Correspondingly, the outward separation width can be more reduced in design than before, which allows a reduction in device dimensions.

In forming the element isolation insulating film 50, as has been previously described with reference to FIG. 2, the lower extruding portion 52 is formed in such a manner that the spacer nitride film 15 of 50- to 200-nm thickness are formed on the side surface of the upper protruding portion 51 and the silicon oxide film 11 is selectively etched using, as an etching mask, the structure of the upper protruding portion 51 which is covered with the silicon nitride film 14 and the spacer nitride film 15. Therefore, the width of the bottom surface of the lower extruding portion 52 can be determined with great accuracy.

Figure 7:
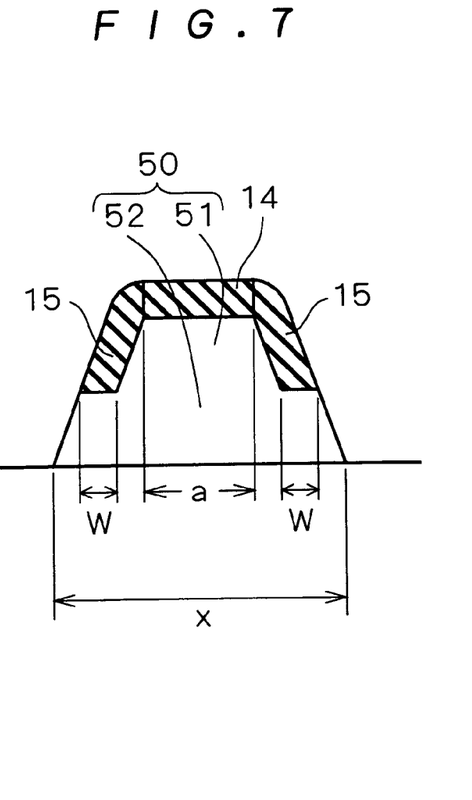
FIG. 7 is an explanatory diagram for the features of the manufacturing method of a semiconductor device according to the first preferred embodiment of the present invention.

More specifically, as shown in FIG. 7, when the lower protruding portion 52 is formed by using, as an etching mask, the structure of the upper protruding portion 51 which is covered with the silicon nitride film 14 and the spacer nitride film 15, the width x of the bottom surface of the lower protruding portion 52 is the total sum of the width a of the silicon nitride film 14 and the horizontal thickness w of the space nitride film 15 on both sides, i.e., $x=a+2w$ (the inclination of the side surface is negligible). Since the thickness w of the spacer nitride film 15 can be set with relatively good controllability, the width x of the bottom surface of the lower protruding portion 52, i.e., the effective separation width, can be determined with great accuracy.

In conventional techniques (cf. Japanese Patent Application Laid-open No. 61-150213) for forming a tapered element isolation insulating film on a silicon substrate by etching, on the other hand, it is impossible to determine the width of the bottom surface with accuracy.

Figure 8:
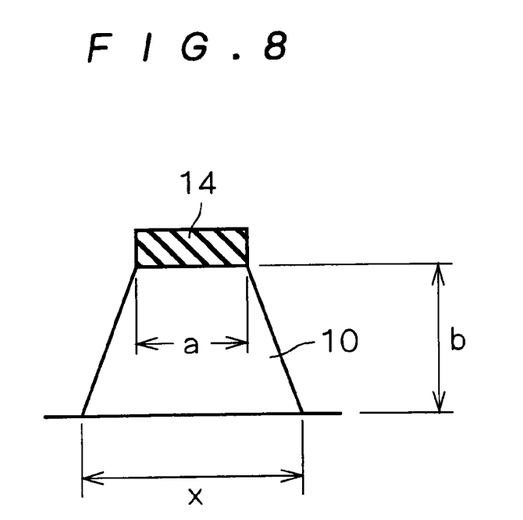
FIG. 8 is a diagram for clear comparison with the features of the manufacturing method of a semiconductor device according to the first preferred embodiment of the present invention.

More specifically, as shown in FIG. 8, when the tapered element isolation Insulating film 10 is formed by using only the silicon nitride film 14 as an etching mask, the width x of the bottom surface of the element isolation insulating film 10 is expressed by $x=a+2b \tan \theta$, where a is the width of the silicon nitride film 14, b is the height (depth) of the element isolation insulating film 10, and $\theta$ is the angle of inclination of the side surface. In this case, the effective separation width depends on the height b and the inclination angle $\theta$. It is, however, difficult to control the inclination angle $\theta$ and consequently, the effective separation width cannot be determined with accuracy.

Contrarily, the width of the bottom surface of the upper protruding portion 52, as above described, is almost uniquely determined by the width of the silicon nitride film 14 and the thickness of the spacer nitride film 15. Thus, even when a narrow active region is defined, an element isolation insulating film with great effective separation width can be obtained by self-alignment.

Figure 9:
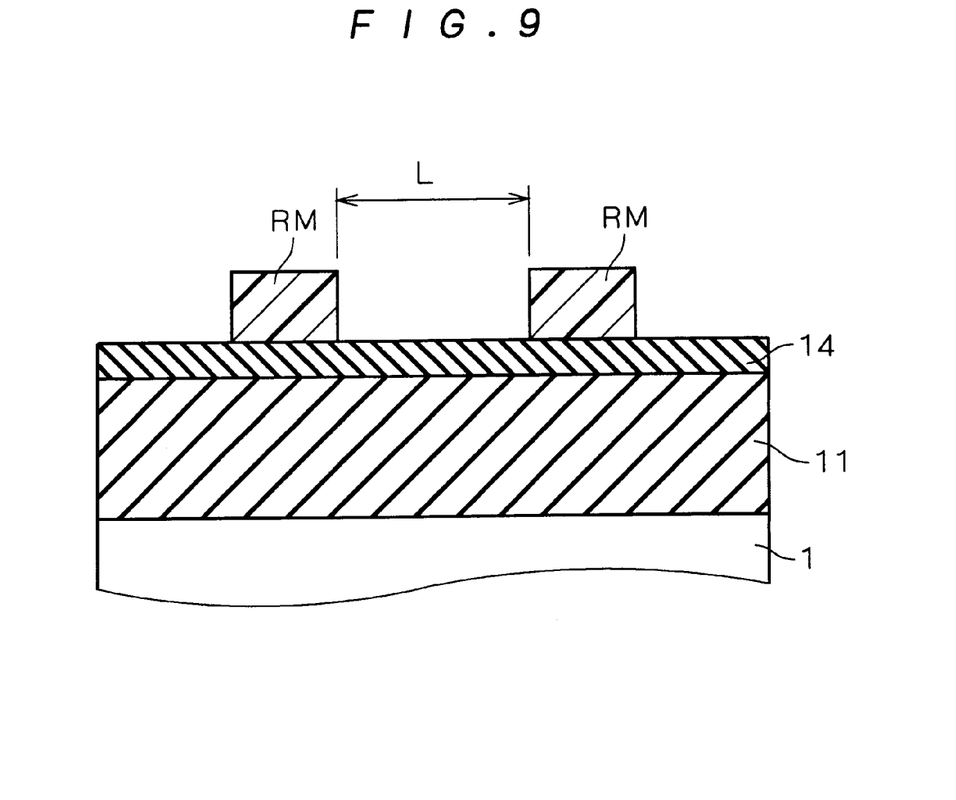
FIGS. 9 and 10 are explanatory diagrams for the features of the manufacturing method of a semiconductor device according to the first preferred embodiment of the present invention.

This feature will further be discussed with reference to FIGS. 9 and 10. FIG. 9 illustrates the selective formation of photoresist masks RM on the silicon nitride film 14, which corresponds to the step of FIG. 2.

In FIG. 9, two photoresist masks RM are located at an interval (for convenience's sake, referred to as a "resolution limit length") L which is close to the resolution limit of photolithography. Since those photoresist masks RM define an active region therebetween, the active region has a width close to the resolution limit length L.

Figure 10:
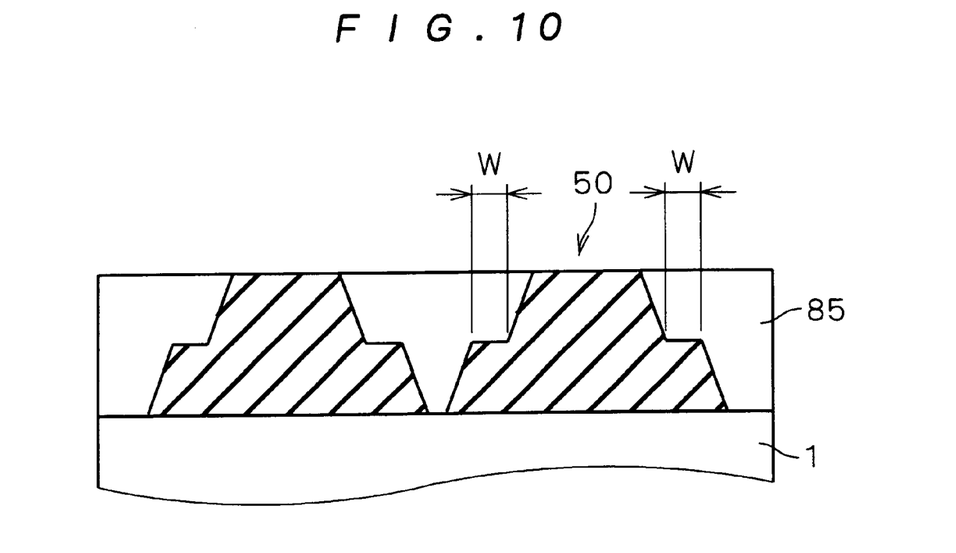

FIG. 10 illustrates the formation of two element isolation insulating films 50 using the photoresist masks RM located at an interval of the resolution limit length L.

As shown in FIG. 10, the two element isolation insulating films 50 have an interval of the resolution limit length L between there respective upper protruding portions 51, so that they can define an active region according to a designed value and the bottom surfaces of their lower protruding portions 52 can be greater in width by 2w than the top surfaces of their upper protruding portions 51. In this fashion, even when a narrow active region is defined, an element isolation insulating film with great effective separation width can be obtained by self-alignment.

To prevent complete electrical isolation of the active region by the two element isolation insulating films 50 being in contact with each other, the thicknesses of the spacer nitride films 15 on the upper protruding portions 51 should be considered.

If the outward separation width of the element isolation insulating film 50 is made equal to the separation width of a conventional element isolation insulating film, the effective separation width becomes further greater than for the conventional element isolation insulating film. In this case, the impurity concentration in a portion of the semiconductor substrate 1 located under the bottom surface of the lower protruding portion 52 can be lowered and the strength of an electric field at pn junctions, which is proportional to the impurity concentration, can be relieved.

Since the element isolation insulating film 50 is formed by thermal oxidation of the semiconductor substrate 1, there will be, in principle, no seam or void that is likely to occur in the process of filling a trench with an insulating film. This allows a dense element isolation insulating film to be formed with stability. In the absence of a seam or void, the doping depth of impurities during impurity doping through the element isolation insulating film 50 can be determined with precision.

Further, the element isolation insulating film 50, which is formed of thermal oxide films, has excellent chemical resistance (small etch rate in wet etching), achieves ease of handling in subsequent steps, and is characteristically in good interface condition with the silicon substrate 1.

B. Second Preferred Embodiment
<B-1. Manufacturing Method>

A method of manufacturing a semiconductor device according to a second preferred embodiment of the present invention will be set forth with reference to FIGS. 11 to 19, illustrating a process sequence for the manufacture of a semiconductor device.

Figure 11:
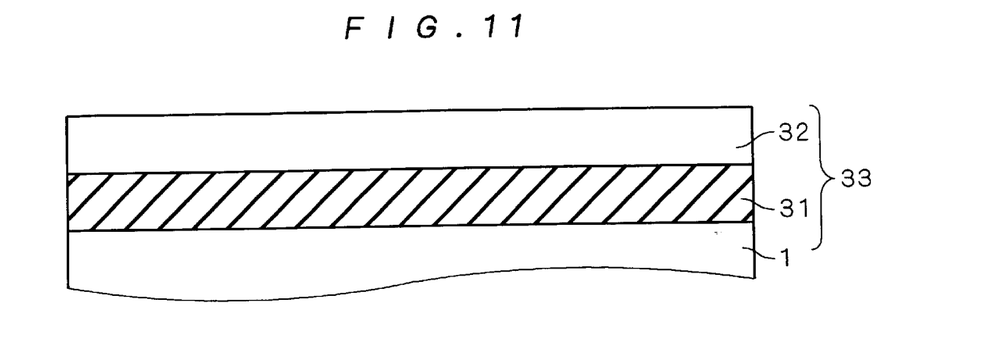
FIGS. 11 to 19 are cross-sectional views illustrating a manufacturing process of a semiconductor device according to a second preferred embodiment of the present invention.

In the step of FIG. 11, an SOI (Silicon On Insulator) 33 including a buried oxide film 31 and an SOI layer 32 is prepared on a semiconductor substrate 1 (single-crystal silicon substrate).

Figure 12:
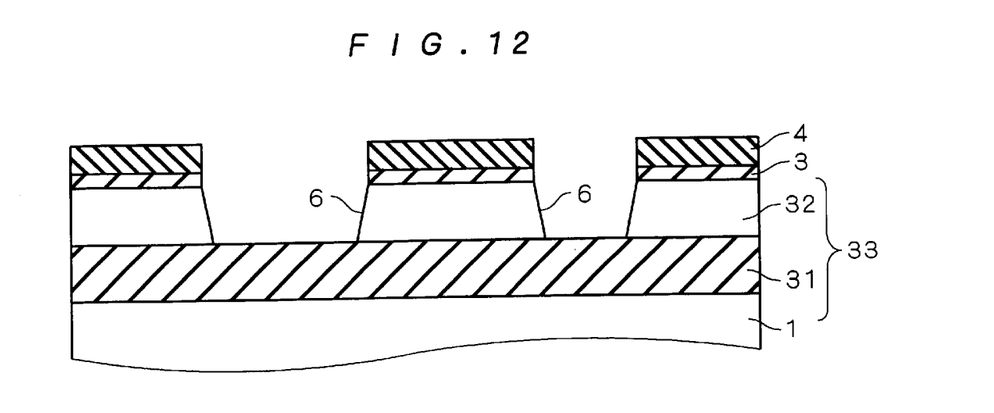

In the step of FIG. 12, a silicon oxide film 3 and a silicon nitride film 4 are sequentially deposited over the whole surface of the SOI layer 32 and photoresist masks (not shown) are selectively formed on regions where element isolation insulating films are formed. Using the photoresist masks, the silicon nitride film 4 and the silicon oxide film 3 are selectively removed by anisotropic etching. After removal of the photoresist masks, the silicon oxide film 3 and the SOI layer 32 are selectively removed by anisotropic etching using the silicon nitride film 4 as a mask, whereby trenches 6 reaching the buried oxide film 31 are formed.

Figure 13:
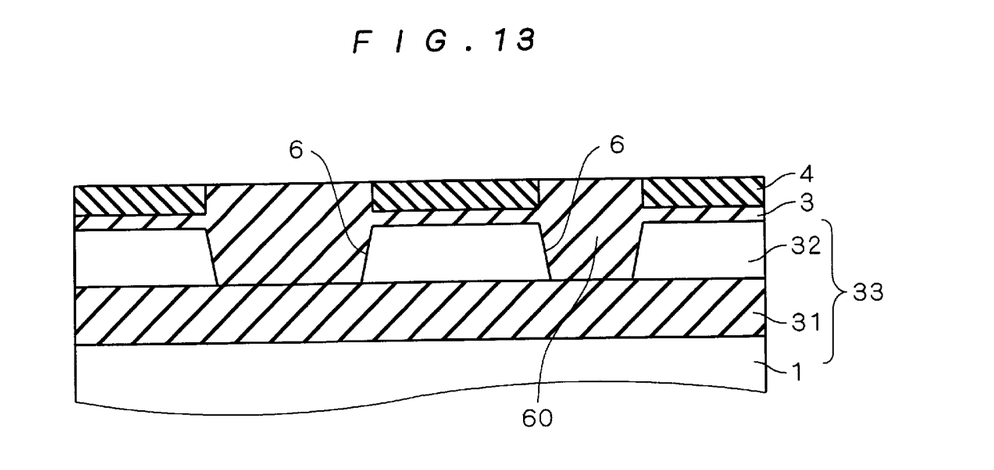

In the step of FIG. 13, after etching damage is eliminated by a technique such as thermal oxidation of the trenches 6, a silicon oxide film 60 is formed over the whole surface by CVD so that the trenches 6 are filled with the silicon oxide film 60. Then, the surface of the silicon oxide film 60 is planarized by CMP using the silicon nitride film 4 as a stopper, whereby the silicon oxide film 60 is left only in the trenches 6.

Figure 14:
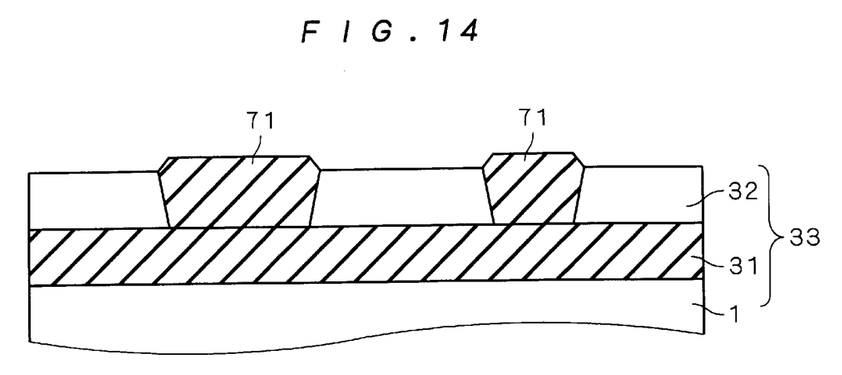

After that, the silicon nitride film 4 and further the silicon oxide film 3 are removed, whereby upper protruding portions 71, the bottom surfaces of which are in contact with the upper surface of the buried oxide film 31, are formed as shown in FIG. 14,. The height of the upper protruding portions 71 is approximately equal to the thickness of the SOI layer 3.

At this time, the upper protruding portions 71 have a tapered cross-sectional shape which narrows with approach from the main surface side of the semiconductor substrate 1 toward their bottom surfaces, but this is not intentional.

Figure 15:
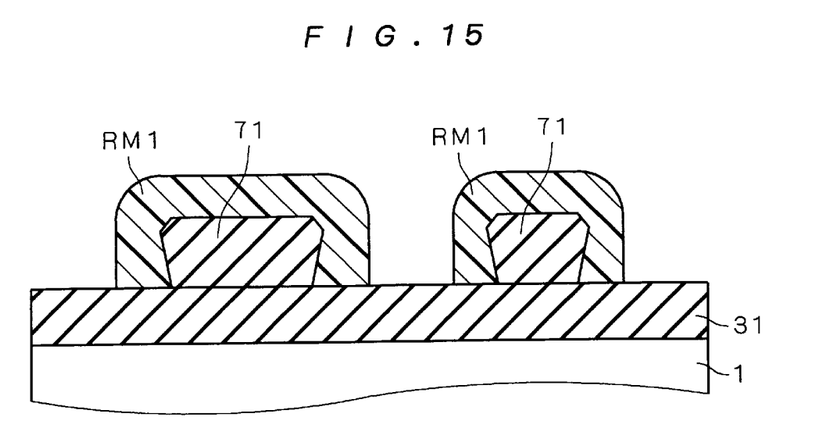

After the SOI layer 32 is removed with aqueous ammonia to expose the buried oxide film 31, the upper protruding portions 71 and their surroundings are covered with photoresist masks RM1 in the step of FIG. 15.

Figure 16:
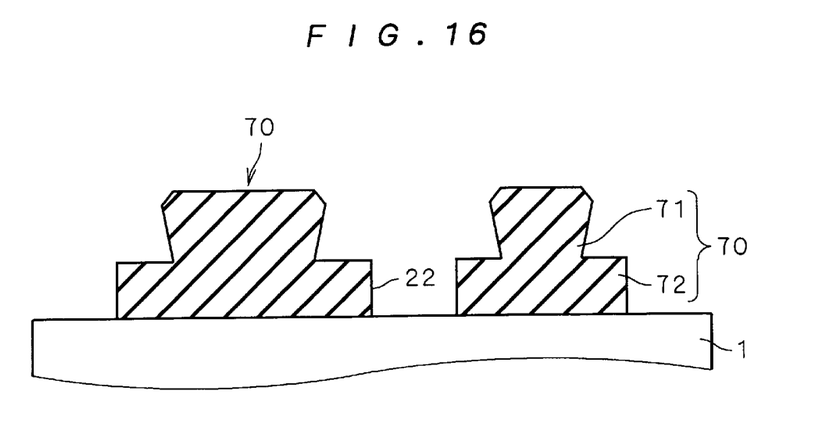

In the step of FIG. 16, using the photoresist masks RM1 as etching masks, the buried oxide film 31 is selectively removed by anisotropic etching to expose the surface of the semiconductor substrate 1 and then, the photoresist masks RM1 are removed, whereby a trench 22 and element isolation insulating films 70 are formed. The element isolation insulating films 70 formed by this step have a two-level protruding cross-sectional shape consisting of two successive protruding portions: the upper protruding portion 71 and a tapered lower protruding portion 72 which is located under the upper protruding portion 71 and is wider than the upper protruding portion 71. FIG. 16 is a cross-sectional view of the semiconductor device in a stage after this step.

Sometimes the lower protruding portion 52 can be of a tapered form, but this is not intentional and in FIG. 16, the side surface that is not inclined is shown.

Figure 17:
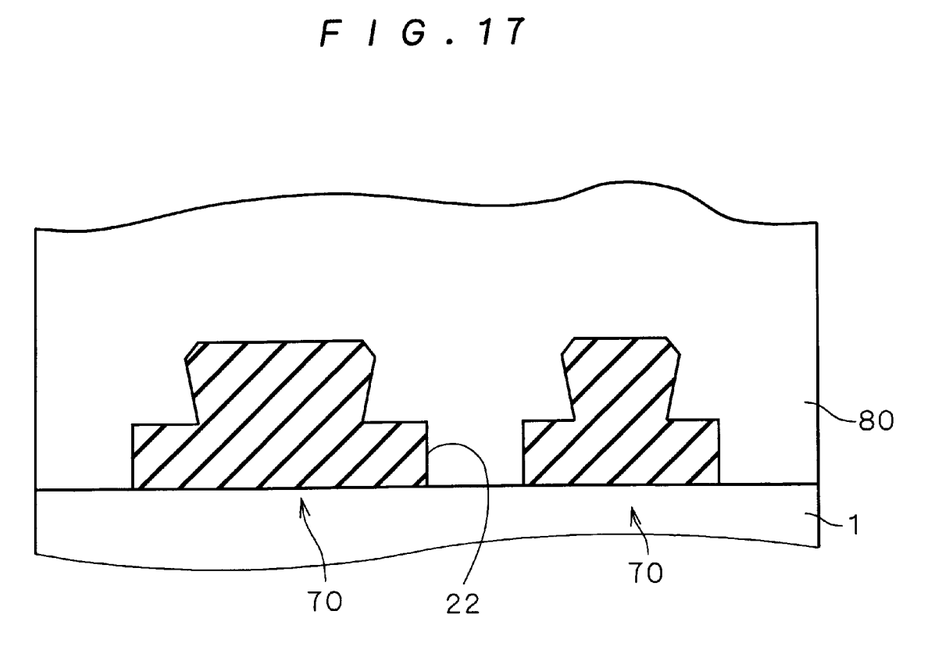

In the step of FIG. 17, a non single-crystal silicon film 80 of 300- to 800-nm thickness is formed by CVD to fill in the trench 22 and to cover the element isolation insulating films 70. FIG. 17 is a cross-sectional view of the semiconductor device in a stage after this step.

Figure 18:
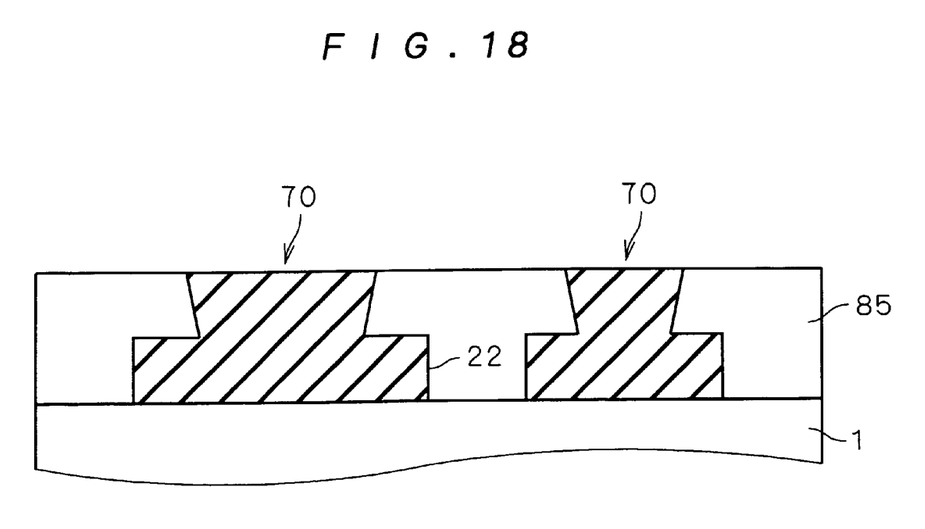

In the step of FIG. 18, for example through thermal processing in a nitrogen atmosphere at 900° C., the non single-crystal silicon film 80 is crystallized into single-crystal form by its epitaxial growth on the main surface of the substrate, whereby an epitaxial silicon film 85 is formed.

The epitaxial silicon film 85 is then planarized by CMP to expose the upper surfaces of the element isolation insulating films 70. This completes the element isolation insulating films 70 each having a two-level protruding cross-sectional shape.

While in FIG. 18 the left- and right-hand element isolation films 70 are formed in different widths, this is just one example and it goes without saying that they may be of the same width.

The procedure and technique for the crystallization of the non single-crystal silicon film 80 into single-crystal form and the procedure to reduce the interface states of the sidewalls of the element isolation insulating films 70 are identical to those described in the first preferred embodiment and thus the description thereof will be omitted.

Subsequently performed are ion implantation (well implantation) for formation of well regions and ion implantation (channel implantation) for determination of the threshold voltage of transistors.

Figure 19:
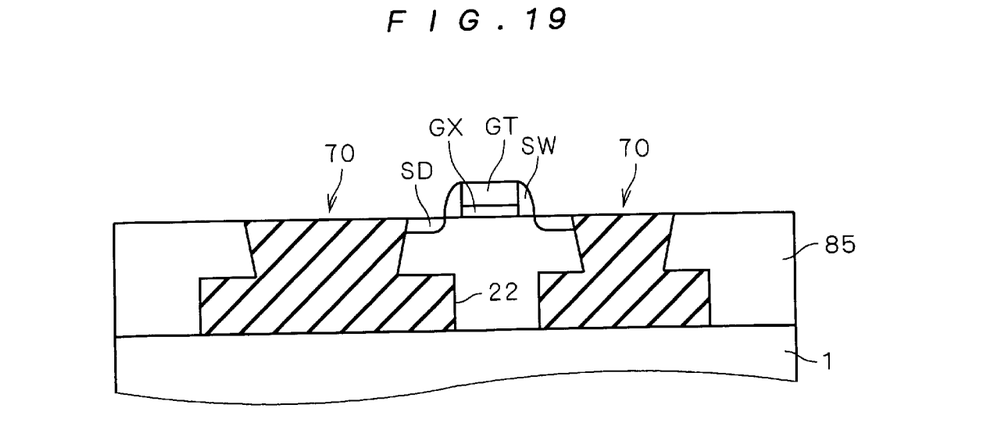

Thereafter, as shown in FIG. 19, a gate insulating film GX, a gate electrode GT, sidewall spacers SW, and the like are formed on each active region defined by the element isolation insulating films 70 and impurity regions such as source/drain regions SD are formed in the surface of the active region, whereby a semiconductor element such as a MOSFET is formed. Such semiconductor elements are connected through a wiring layer, which completes a semiconductor device.

<B-2. Function and Effect>

As has been described so far, the manufacturing method of this preferred embodiment can produce the element isolation insulating film 70 having the two-level protruding shape. Since the width of the bottom surface (effective separation width) is greater than the width of the top surface (outward separation width), the element isolation insulating films 70 has a greater separation width and higher separation capability than the element isolation insulating film 30 shown in FIG. 20. Correspondingly, the outward separation width can be more reduced in design than before, which allows a reduction in device dimensions.

If the outward separation width of the element isolation insulating film 70 is made equal to the separation width of a conventional element isolation insulating film, the effective separation width becomes further greater than for the conventional element isolation insulating film. In this case, the impurity concentration of impurities in a portion of the semiconductor substrate 1 located under the bottom surface of the lower protruding portion 72 can be lowered and the strength of an electric field at pn junctions, which is proportional to the impurity concentration, can be relieved.

Since the lower protruding portion 72 of the element isolation insulating film 70 is formed by etching of the buried oxide film 31 and only the relatively shallow upper Protruding portion 71 is formed by the burying technique, the possibility that a seam or void may occur in the process of filling a trench with an insulating film is small and consequently, a dense element isolation insulating film can be formed with stability. In the absence of a seam or void, the doping depth of impurities during impurity doping through the element isolation insulating film 70 can be determined with precision.

In the manufacturing method of this preferred embodiment, the conventional manufacturing method can be adopted in the formation of the upper protruding portion 71, while the lower protruding portion 72 can be formed by etching of the buried oxide film 31 in the SOI substrate 33. This reduces the manufacturing cost.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) forming an insulating film on a whole main surface of a semiconductor substrate;
   (b) selectively forming an etching mask on a whole surface of said insulating film and selectively etching said insulating film by using said etching mask to such an extent as not to expose said main surface of said semiconductor substrate, thereby to pattern a portion of said insulating film which is covered with said etching mask into an upper protruding portion;
   (c) forming a spacer to cover a side surface of said upper protruding portion;
   (d) removing a portion of said insulating film which is not covered with said etching mask and said spacer by etching so as to expose said main surface of said semiconductor substrate, thereby to pattern a portion of said insulating film which is covered with said upper protruding portion and said spacer into a lower protruding portion;
   (e) removing said etching mask and said spacer and thereby forming an element isolation insulating film having a two-level protruding shape including a succession of said upper protruding portion and said lower protruding portion which is wider than said upper protruding portion; and
   (f) filling in a pattern defined by said element isolation insulating film with a single-crystal semiconductor film.

2. The method according to claim 1, wherein said insulating film is formed of a thermal oxide film.

3. The method according to claim 1, wherein said spacer is formed of a silicon nitride film, and said step (c) includes the steps of:
   forming a silicon nitride film on a whole surface including a surface of said etching mask; and
   removing said silicon nitride film by anisotropic etching so that said silicon nitride film is left as said spacer on the side surface of said upper protruding portion.

4. The method according to claim 1, wherein said semiconductor substrate is a single-crystal silicon substrate, and said step (f) includes the steps of:
   (f-1) filling in a pattern defined by said element isolation insulating film with a non single-crystal silicon film; and
   (f-2) crystallizing said non single-crystal silicon film into a single-crystal silicon film by epitaxial growth on said single-crystal silicon substrate.

5. The method according to claim 4, wherein said step (f-1) includes the step of completely covering said element isolation insulating film with said non single-crystal silicon film, and said step (f-2) includes the step of planarizing said single-crystal silicon film until an upper surface of said element isolation insulating film is exposed, so that said single-crystal silicon film is left only in a pattern defined by said element isolation insulating film.

6. The method according to claim 4, wherein said step (f-1) includes the steps of:
   completely covering said element isolation insulating film with said non single-crystal silicon film; and
   planarizing said non single-crystal silicon film until an upper surface of said element isolation insulating film is exposed, so that said non single-crystal silicon film is left only in a pattern defined by said element isolation insulating film.

7. The method according to claim 1, wherein said semiconductor substrate is a single-crystal silicon substrate, and said step (f) includes the step of growing a single-crystal silicon film on said single-crystal silicon substrate by selective epitaxial growth in a pattern defined by said element isolation insulating film.

* * * * *